(12) United States Patent
Zhou et al.

(10) Patent No.: US 10,332,698 B2
(45) Date of Patent: Jun. 25, 2019

(54) SYSTEM AND METHOD FOR MONITORING CONTACT LIFE OF A CIRCUIT INTERRUPTER

(71) Applicant: EATON CORPORATION, Cleveland, OH (US)

(72) Inventors: Xin Zhou, Wexford, PA (US); Zhi Gao, Warrendale, PA (US); James L. Lagree, Robinson Township, PA (US); Robert W. Mueller, Aliquippa, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 15/386,953

(22) Filed: Dec. 21, 2016

(65) Prior Publication Data

US 2018/0172767 A1 Jun. 21, 2018

(51) Int. Cl.
*G01R 31/327* (2006.01)
*H01H 9/54* (2006.01)
(Continued)

(52) U.S. Cl.
CPC ............ *H01H 9/54* (2013.01); *H01H 1/0015* (2013.01); *H01H 71/04* (2013.01); *G01R 31/3277* (2013.01); *H01H 2071/044* (2013.01)

(58) Field of Classification Search
CPC ...... G01R 31/333; G01R 31/327; H01H 9/54; H01H 1/0015; H01H 1/20; H01H 2071/044; H01H 89/06; G01N 17/00; G01N 17/02
See application file for complete search history.

(56) References Cited

U.S. PATENT DOCUMENTS 5,341,191 A 8/1994 Crookston et al.
5,910,760 A 6/1999 Malingowski et al.
(Continued)

FOREIGN PATENT DOCUMENTS

KR 2014 0006413 A 1/2014
WO 00/39822 A1 7/2000

OTHER PUBLICATIONS

Jonathan Swingler and John W. McBride; Modeling of Energy Transport in Arcing Electrical Contacts to Determine Mass Loss; IEEE Transactions on Components, Packaging, and Manufacturing Technology—Part A, vol. 21, No. 1, Mar. 1998; pp. 54-60.*
(Continued)

*Primary Examiner* — Son T Le
(74) *Attorney, Agent, or Firm* — Eckert Seamans

(57) ABSTRACT

An electronic trip unit for a circuit interrupter includes a line side voltage sensing module for measuring first voltages on a line side of separable contacts, a load side voltage sensing module for measuring second voltages on a load side of the separable contacts, a current sensor, and a main controller. The main controller is further structured and configured to: (i) for each of a plurality of arc interruption events in the circuit interrupter, determine a mass loss due to contact erosion during the arc interruption event based on one or more of the first voltages, the second voltages and the current measured by the current sensor, (ii) determine a total mass loss based on each determined mass loss due to contact erosion, and (iii) monitor a remaining life of the separable contacts based on the determined total mass loss due to contact erosion.

21 Claims, 2 Drawing Sheets

(51) Int. Cl.
*H01H 1/00* (2006.01)
*H01H 71/04* (2006.01)

(56) References Cited

U.S. PATENT DOCUMENTS

| | | | |
|---|---|---|---|
| 6,144,271 A | 11/2000 | Mueller et al. | |
| 6,466,023 B2* | 10/2002 | Dougherty | H01H 1/0015 324/422 |
| 2006/0028235 A1* | 2/2006 | Rapant | H01F 29/04 307/137 |
| 2008/0036561 A1* | 2/2008 | Hartinger | H01H 1/0015 335/156 |
| 2012/0306656 A1* | 12/2012 | Boucher | H01H 33/26 340/638 |

OTHER PUBLICATIONS

Kiyoshi Yoshida et al: "Influence of Voltage on Arc Characteristics and Electrode Mass Change of AgNi Contacts for Electromagnetic Contactors", IEICE Transactions on Electronics, Institute of Electronics, Tokyo, JP, vol. E94C, No. 9, Sep. 1, 2011, pp. 1395-1401.
European Patent Office, "Extended European Search Report" (corresp. to EP 17205682.2), dated May 4, 2018, 8 pp.

* cited by examiner

SYSTEM AND METHOD FOR MONITORING CONTACT LIFE OF A CIRCUIT INTERRUPTER

BACKGROUND

Field

The disclosed concept pertains generally to circuit interrupters and, more particularly, to a trip unit embedded system and method for monitoring the contact life of the contacts of a circuit interrupter.

Background Information

Electrical switching apparatus such as circuit interrupters and, in particular, circuit breakers (e.g., of the molded case variety), are well known in the art. See, for example, U.S. Pat. No. 5,341,191.

Circuit breakers are used to protect electrical circuitry from damage due to an overcurrent condition, such as an overload condition or a relatively high level short circuit or fault condition. Molded case circuit breakers typically include a pair of separable contacts per phase. The separable contacts may be operated either manually by way of a handle disposed on the outside of the case or automatically in response to an overcurrent condition. Typically, such circuit breakers include: (i) an operating mechanism which is designed to rapidly open and close the separable contacts, and (ii) a trip unit which senses overcurrent conditions in an automatic mode of operation. Upon sensing an overcurrent condition, the trip unit sets the operating mechanism to a trip state, which moves the separable contacts to their open position.

Industrial molded case circuit breakers often use a circuit breaker frame which houses a trip unit. See, for example, U.S. Pat. Nos. 5,910,760; and 6,144,271. The trip unit may be modular and may be replaced in order to alter the electrical properties of the circuit breaker.

It is well known to employ trip units which utilize a microprocessor to detect various types of overcurrent trip conditions and to provide various protection functions, such as, for example, a long delay trip, a short delay trip, an instantaneous trip, and/or a ground fault trip.

Reliable prediction of the remaining contact life is always a challenge for circuit breakers. One known approach is to monitor the number of switching or interruption operations and, based on manufacturer product specifications, determine whether the contacts need to be serviced or the breaker needs to be replaced. However, this approach can grossly overestimate or underestimate the true contact life resulting from fault and load conditions under which the breaker has been operated. In particular, even though the number of operations may be easily monitored, that information may not provide accurate information regarding contact life because the arc energy during each operation can be very different and therefore the erosion of the contacts during each operation can be very different.

SUMMARY

In one embodiment, an electronic trip unit for a circuit interrupter having a set of separable contacts is provided. The electronic trip unit includes a line side voltage sensing module structured to measure first voltages on a line side of the separable contacts, a load side voltage sensing module structured to measure second voltages on a load side of the separable contacts, a current sensor structured to measure a current flowing through a line to which the separable contacts are coupled, and a main controller structured and configured to receive first voltage information based on measurements made by the line side voltage sensing module, second voltage information based on measurements made by the load side voltage sensing module, and current information based on measurements made by the current sensor. The main controller is further structured and configured to: (i) for each of a plurality of arc interruption events in the circuit interrupter, determine a mass loss due to contact erosion during the arc interruption event based on one or more of the first voltage information, the second voltage information and the current information, (ii) determine a total mass loss based on each determined mass loss due to contact erosion, and (iii) monitor a remaining life of the separable contacts based on the determined total mass loss due to contact erosion.

In another embodiment, a method of monitoring a set of separable contacts of a circuit interrupter is provided. The method includes measuring first voltages on a line side of the separable contacts, measuring second voltages on a load side of the separable contacts, measuring a current flowing through a line to which the separable contacts are coupled, and receiving first voltage information based on the measured first voltages, second voltage information based the measured second voltages, and current information based the measured current. The method further includes, for each of a plurality of arc interruption events in the circuit interrupter, determining a mass loss due to contact erosion during the arc interruption event based on one or more of the first voltage information, the second voltage information and the current information. The method still further includes determining a total mass loss due to contact erosion based on each determined mass loss due to contact erosion, and monitor a remaining life of the separable contacts based on the determined total mass loss due to contact erosion.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
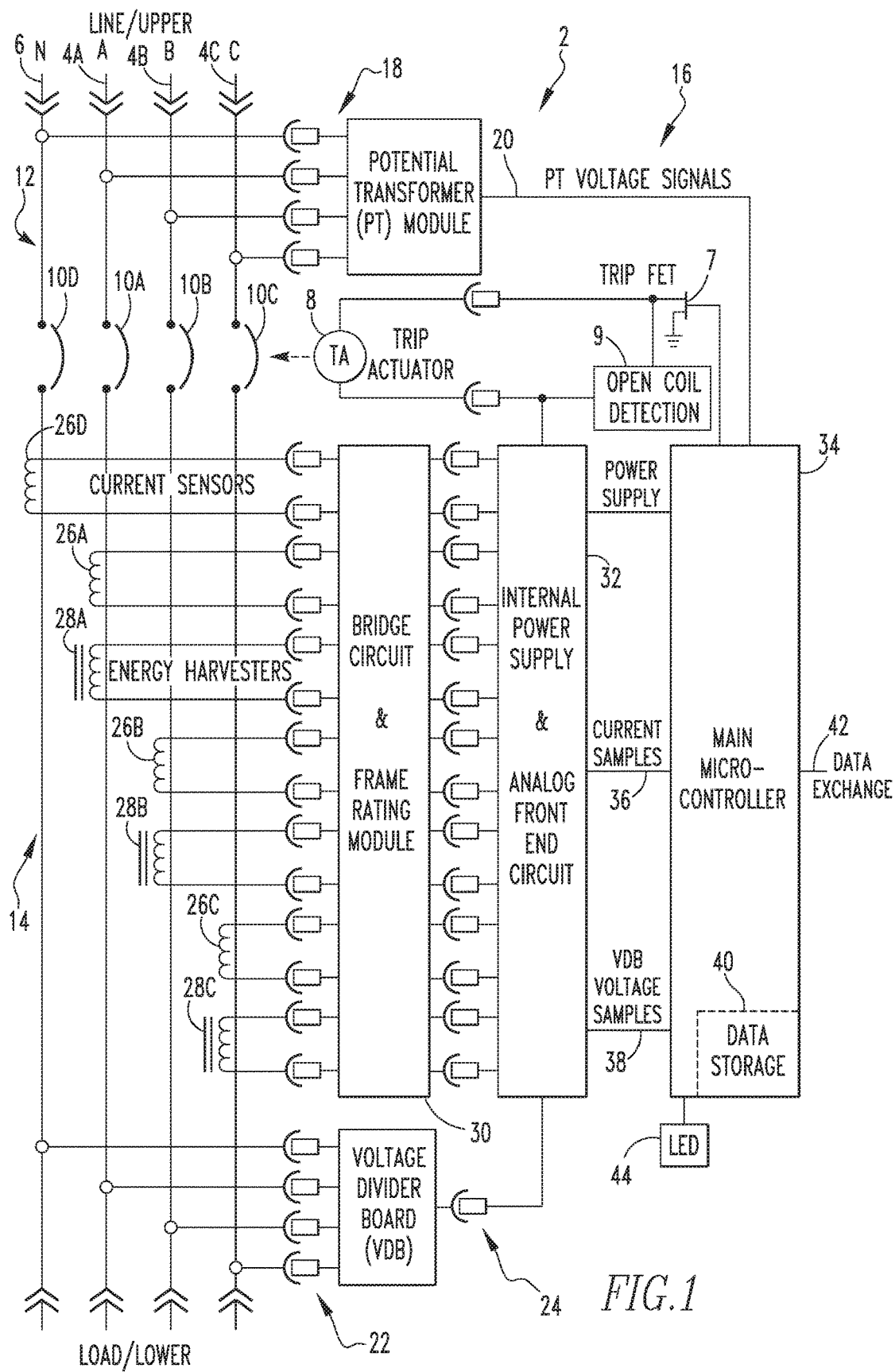
FIG. 1 is a schematic diagram of a circuit interrupter according to a non-limiting, exemplary embodiment of the disclosed concept.

Directional phrases used herein, such as, for example, left, right, front, back, top, bottom and derivatives thereof, relate to the orientation of the elements shown in the drawings and are not limiting upon the claims unless expressly recited therein. As employed herein, the term "number" shall mean one or an integer greater than one (i.e., a plurality).

As employed herein, the statement that two or more parts are "coupled" together shall mean that the parts are joined together either directly or joined through one or more intermediate parts.

As used herein, the term "controller" shall mean a programmable analog and/or digital device (including an associated memory part or portion) that can store, retrieve, execute and process data (e.g., software routines and/or information used by such routines), including, without limitation, a field programmable gate array (FPGA), a complex programmable logic device (CPLD), a programmable system on a chip (PSOC), an application specific integrated circuit (ASIC), a microprocessor, a microcontroller, a programmable logic controller, or any other suitable processing device or apparatus. The memory portion can be any one or more of a variety of types of internal and/or external storage media such as, without limitation, RAM, ROM, EPROM(s), EEPROM(s), FLASH, and the like that provide a storage register, i.e., a non-transitory machine readable medium, for data and program code storage such as in the fashion of an internal storage area of a computer, and can be volatile memory or nonvolatile memory.

As described in greater detail herein in connection with the various embodiments, the disclosed concept enables the remaining contact life of a circuit interrupter such as a circuit breaker to be monitored or predicted based on either the total arc energy or the total electrical charge during each operation (i.e., opening or closing of the contacts) of the circuit interrupter. Specifically, the amount of arc energy and electrical charge each are directly related to the amount of contact erosion that occurs during each operation. Therefore, according to the disclosed concept, the amount of contact erosion can be monitored and estimated based on this information. Current electronic trip units have high-speed current and voltage sampling capability. Thus, both arc current and arc voltage can be calculated accurately during each operation, and, as described herein (and depending on the properties of the contact material), that information can be used to determine total arc energy or the total electrical charge to estimate the actual contact erosion that occurs during each operation.

FIG. 1 is a schematic diagram of circuit interrupter 2 according to a non-limiting, exemplary embodiment of the disclosed concept. As seen in FIG. 1, circuit interrupter 2 is coupled to a 3-phase power system including phase lines 4A, 4B, and 4C and neutral line 6. In the illustrated embodiment, circuit interrupter 2 is a molded case circuit breaker. It will be understood, however, that circuit interrupter 2 may take on forms other than a molded circuit breaker within the scope of the disclosed concept. Circuit interrupter 2 includes an operating mechanism configured to rapidly open and close a set of separable contacts 10 (labeled 10A-10D) for each phase and for the neutral that are provided as part of circuit interrupter 2. In the illustrated exemplary embodiment, the operating mechanism includes a trip field-effect transistor (FET) 7, a trip actuator 8, and an open coil detection circuit 9. Separable contacts 10 define a line side 12 of circuit interrupter 2 on a first (e.g., upper) side of separable contacts 10 and a load side 14 of circuit interrupter 2 on a second (e.g., upper) side of separable contacts 10.

Circuit interrupter 2 also includes an electronic trip unit 16 operatively coupled to the operating mechanism including trip actuator 8 which, in an automatic mode of operation, is structured to sense overcurrent conditions and in response thereto move trip actuator 8 to a state wherein separable contacts 10 of circuit interrupter 2 are opened. In the exemplary embodiment, electronic trip unit 16 is selectively configurable (e.g., by way of a number of adjustable switches (not shown) or via electronic settings communicated to electronic trip unit 16) for varying the functional trip settings (such as, for example and without limitation, long delay pickup (Ir), long delay time (LDT), short delay pickup (SDPU), ground fault pickup (GFPU), and short delay time and ground fault time (SDT/GFT)) of electronic trip unit 16.

As seen in FIG. 1, electronic trip unit 16 includes a number of sensing modules for sensing the voltages on and the currents flowing through phase lines 4A, 4B, and 4C and neutral line 6. In particular, electronic trip unit 16 includes a line side voltage sensing module 18, which in the exemplary embodiment includes a potential transformer module, that is structured to sense the line side voltage on each of phase lines 4A, 4B and 4C and neutral line 6 and output line side voltage signals 20 indicative of those voltages. Electronic trip unit 16 also includes a load side voltage sensing module 22, which in the exemplary embodiment includes a voltage divider board, that is structured to sense the load side voltage on each of phase lines 4A, 4B and 4C and neutral line 6 and output load side voltage signals 24 (in analog form) indicative of those voltages. Thus, line side voltage sensing module 18 and load side voltage sensing module 22 are mounted and configured in such a way as to measure voltages on the opposite sides of separable contacts 10. In this configuration, they provide the capability of measuring the voltage drop or voltage difference across each separable contact 10 without violating the galvanic isolation via use of the potential transformer across separable contacts 10. In an alternative embodiment, line side voltage sensing module 18 could include a voltage divider board and load side voltage sensing module 22 could include a potential transformer module.

Electronic trip unit 16 further includes current sensors 26A, 26B, 26C, and 26D that are structured to sense the current flowing through each of phase lines 4A, 4B and 4C and neutral line 6, respectively. In the exemplary embodiment, each current sensor 26A, 26B, 26C, and 26D is a Rogowski-coil-based current sensor which generates a linear output signal with respect to the primary current it measures over a wide operating range. This characteristic is due to the use of non-magnetic cores in Rogowski-coil-based current sensors. As seen in FIG. 1, electronic trip unit 16 also includes energy harvesters 28A, 28B and 28C each operatively coupled to and associated with a respective phase line 4A, 4B and 4C. Energy harvesters 28A, 28B and 28C each generate power from the primary currents through electromagnetic coupling, and hence provide energy to operate the electronic circuitry of circuit interrupter 2 in the case where a separate power supply is not available.

Finally, electronic trip unit 16 includes a bridge circuit and frame rating module 30, an internal power supply and analog front end circuit 32, and a main microcontroller 34. Main controller 34 is provided with firmware which enables it to control the operation of electronic trip unit 16 as described in detail herein. As noted elsewhere herein, main controller 16 may be, for example and without limitation, a microprocessor (μP), a microcontroller or some other suitable processing device.

Bridge circuit and frame rating module 30 serves two primary purposes in circuit interrupter 2. First, it rectifies the power generated by energy harvesters 28A, 28B and 28C, and passes the rectified power to internal power supply and analog front end circuit 32 for subsequent use. Second, it passes the outputs from current sensors 26A, 26B, 26C, and 26D to internal power supply and analog front end circuit 32 for analog-to-digital conversion.

Internal power supply and analog front end circuit 32 receives the outputs from bridge circuit and frame rating module 30 as inputs thereto. Internal power supply and analog front end circuit 32 also receives load side voltage signals 24 as inputs thereto. The internal power supply section of internal power supply and analog front end circuit 32 further processes the rectified power along with other power sources, and supplies power to both main microcontroller 34 and the operating mechanism circuitry including trip FET 7, trip actuator 8, and open coil detection circuit 9. The analog front end section of internal power supply and & analog front end circuit 32 converts the outputs from current sensors 26A, 26B, 26C, and 26D and the load side voltage signals 24 into discrete-time current samples 36 and discrete-time load side voltage samples 38, respectively.

Main microcontroller 34 receives power from internal power supply and analog front end circuit 32. In addition, as seen in FIG. 1, main microcontroller 34 receives line side voltage signals 20, current samples 36, and load side voltage samples 38 as inputs thereto. Through continuous monitoring of circuit-breaker-related electrical quantities, including line side voltage signals 20, current samples 36, and load side voltage samples 38, main microcontroller 34 determines when to activate trip actuator 8 through trip FET 7, and ultimately disconnect power to the load/lower side by opening separable contacts 10.

In addition, according to the disclosed concept, main microcontroller 34 monitors the erosion of each of separable contacts 10 during operation of circuit interrupter 2, and based thereon estimates the remaining life of each separable contact 10. That information may then be used to provide alerts to a user or maintenance personnel indicating whether circuit interrupter 2 needs to be serviced or replaced. In particular, based on line side voltage signals 20, current samples 36, and load side voltage samples 38, main microcontroller 34 computes, for each operation of circuit interrupter 2 (i.e., each arc interruption), the arc energy W, the amount of electrical charges during arc interruption Q, the mass loss due to arc erosion of contacts during interruption $\Delta m$, and, based on those values, estimates the remaining contact life. The computed quantities are stored in data storage 40 of main microcontroller 34 through the use of volatile and/or non-volatile memories, and/or may be communicated to end users or other devices via a data exchange port 42 of main microcontroller 34. Furthermore, main controller 34 is provided with a light emitting diode (LED) 44 or other similar indicator which visually indicates the state of separable contacts 10 to a user as described herein.

Figure 2:
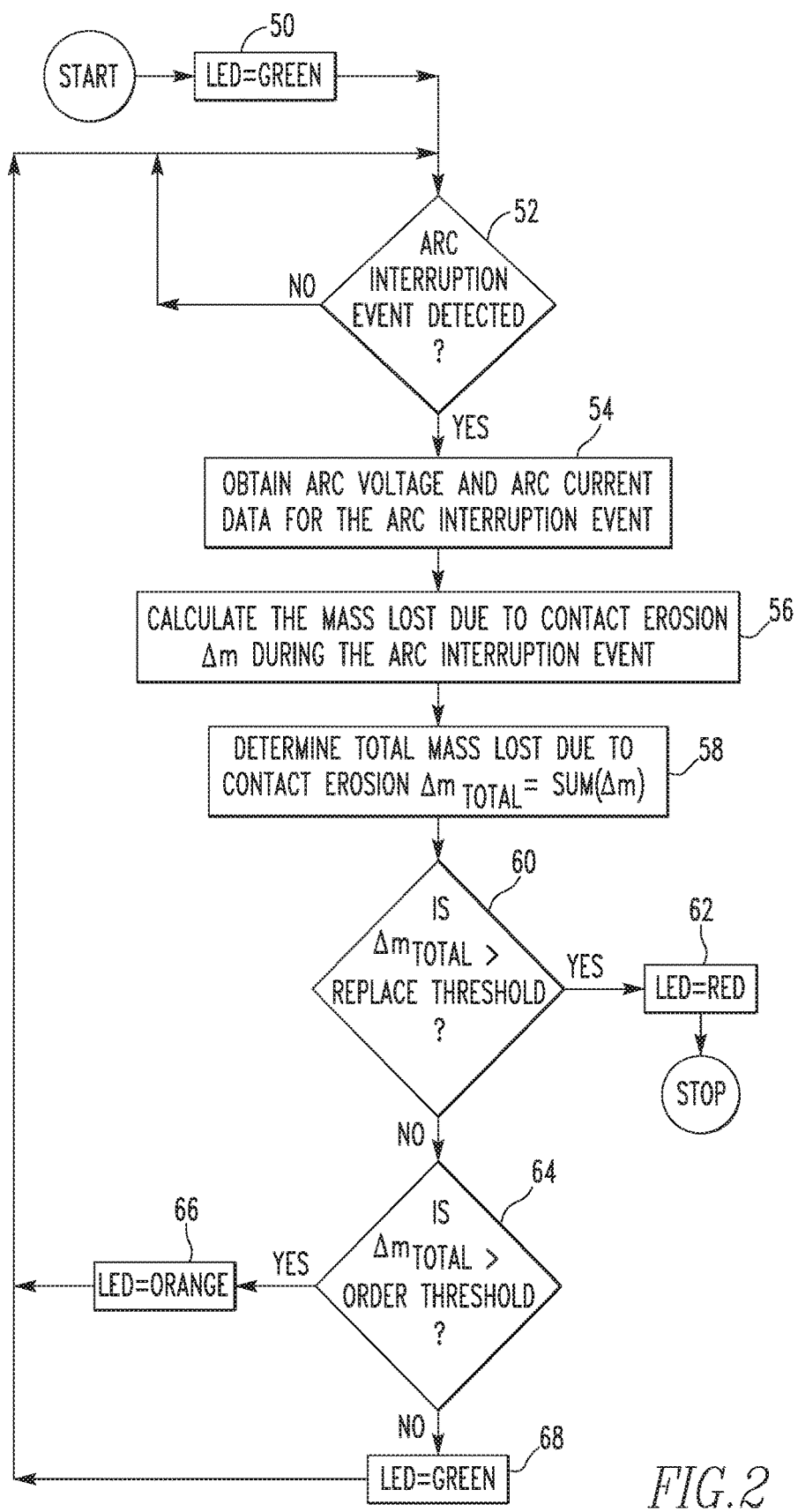
FIG. 2 is a flow diagram illustrating operation of the circuit interrupter of FIG. 1 according to the non-limiting, exemplary embodiment of the disclosed concept.

FIG. 2 is a flowchart illustrating operation of electronic trip unit 16 according to an exemplary embodiment of the disclosed concept. The method shown in FIG. 2 is, in the exemplary embodiment, implemented in main controller 34 via a number of firmware routines stored in the memory portion of main controller 34 and executable by the processing portion of main controller 34. The method shown in FIG. 2 is applicable to a single one of the separable contacts 10 of circuit interrupter 2 (i.e., a single phase). However, as will be appreciated, the method may be implemented simultaneously for each separable contact 10 of circuit interrupter 2 (i.e., each phase) using voltage and current measurements applicable to particular the separable contact 10. In the embodiment shown in FIG. 2, LED 44 is used to provide alerts which indicate the state of the separable contacts 10 in question. In the illustrated embodiment, LED 44 is lit in (i) a GREEN condition to indicate that the separable contacts 10 are all in good condition, (ii) an ORANGE condition to indicate that at least one of the separable contacts 10 is near its serviceable period (i.e., close to the end of it life) such that replacement parts or a replacement circuit interrupter 2 needs to be ordered, and (iii) a RED condition to indicate that at least one of the separable contacts is at the end of its life such that circuit interrupter 2 should not be operated further and should be immediately replaced.

The method of FIG. 2 begins at step 50, wherein a flag or variable for the LED condition for the separable contact 10 in question is set to GREEN. Next, at step 52, a determination is made as to whether main controller 34 has detected the occurrence of an arc interruption event. If the answer is no, then the method returns to step 52 to continue monitoring for the occurrence of arc interruption events. If the answer at step 52 is yes, meaning that an arc interruption event and arcing time t has occurred, then the method proceeds to step 54. At step 54, main controller 34 obtains arc voltage and arc current data for the arc interruption event that occurred. In the exemplary embodiment, the arc current data at any particular time during the arcing time t may be obtained from the current samples 38 that are collected by main controller 34, and the arc voltage data at any particular time during the arcing time t may be calculated based on the difference between the measured line and load voltages at the particular time using the line voltage signals 20 and the load voltage samples 24. Next, at step 56, main controller 34 calculates the mass loss due to contact erosion, $\Delta m$, during the arc interruption event using either or both of the arc voltage data and the arc current data. According to the disclosed concept, the mass loss due to contact erosion $\Delta m$ during the arc interruption event may be calculated using either of two alternative techniques, each of which is described below.

In the first technique, which is based on the total arc energy W during the arc interruption event, arc energy W is first determined according to the following expression:

$$W = \int_0^t VI\,dt \text{ (Joule)},$$

where W is the arc energy, t is the arcing time, V is the arc voltage and I is the arc current. Then, the mass loss due to contact erosion $\Delta m$ during the arc interruption event is calculated based on the following equation:

$$\Delta m = K \times \phi\left(\frac{mg}{\text{Joule}}\right) \times W(\text{Joule}),$$

where $\Delta m$ is the mass loss due to arc erosion of contacts during interruption, $\phi$ is the mass loss per Joule for the material used in separable contacts 10, and K is a coefficient that reflects the time duration during which the arc stays on contacts.

In the second technique, which is based on total electrical charges Q during the arc interruption, total electrical charges Q is first determined according to the following expression:

$$Q = \int_0^t I\,dt \text{ (Coulomb)},$$

where Q is the amount of electrical charges and t is the arcing time. Then, the mass loss due to contact erosion $\Delta m$ during the arc interruption event is calculated based on the following equation:

$$\Delta m = K \times \delta\left(\frac{mg}{\text{Coulomb}}\right) \times Q(\text{Coulomb}),$$

where $\Delta m$ is the mass loss due to arc erosion of contacts during interruption, $\delta$ is the mass loss per Coulomb of electrical charge for the material used in separable contacts 10, and K is a coefficient that reflects the time duration during which the arc stays on contacts.

Then, after the mass loss due to contact erosion $\Delta m$ during the arc interruption event is calculated using either of the above-described techniques, the method proceeds to step 58.

At step 58, the total mass loss due to contact erosion during the life of circuit interrupter 2 is determined. In the exemplary embodiment, this is done by maintaining and updating a running sum variable $\Delta m_{total}$, which is initialized as zero and is updated by adding $\Delta m$ to the prior total each time $\Delta m$ is calculated.

Furthermore, according to an aspect of the disclosed concept, based on circuit interrupter and contact performance characteristics, multiple thresholds of contact mass loss can be set to alert customers or maintenance personal as to whether circuit interrupter 2 needs to be serviced or replaced. For different contact materials and interrupters, these thresholds will be different. Thus, following step 58, the method of FIG. 2 proceeds to step 60, wherein a determination is made as to whether $\Delta m$ total is greater than a predetermined "replacement" threshold. If the answer is yes, then the method proceeds to step 62, wherein the LED condition flag for the separable contact 10 is set to RED. If, however, the answer at step 60 is no, then the method proceeds to step 64. At step 64, a determination is made as to whether $\Delta m_{total}$ is greater than an "order parts" threshold, which is lower than the replace threshold. If the answer is yes, then the method proceeds to step 66, wherein the LED condition flag for the separable contact is set to ORANGE, and thereafter the method returns to step 52. If, however, the answer at step 64 is no, then the method proceeds to step 68, wherein the LED condition flag for the separable contact 10 is set to GREEN, and thereafter the method returns to step 52.

According to a further aspect of the disclosed concept, main controller 34 will monitor the LED condition flags for each of the separable contacts 10 and will cause LED 44 to be lit RED if any of the flags is in a RED condition, will cause LED 44 to be lit ORANGE if none of the flags is in a RED condition but at least one of the flags is in an ORANGE condition, and will be lit GREEN if none of the flags is in a RED or ORANGE condition.

In one exemplary embodiment, the remaining life of separable contacts 10 is monitored based on the determined total mass loss due to contact erosion as subtracted from an original contact mass of separable contacts. It will be appreciated that various circuit interrupters have different contact masses and that, in order to implement this embodiment, the original contact mass will be determined before any arc interruption event has occurred.

In another exemplary embodiment, the method may be implemented in a communications system to report information regarding the remaining life of separable contacts 10 to a remote supervisory control and data acquisition (SCADA) system using wireless or wired communication, to a tablet or to a smart phone.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. An electronic trip unit for a circuit interrupter, the circuit interrupter having a set of separable contacts, the electronic trip unit comprising:
   a line side voltage sensing module structured to measure first voltages on a line side of the separable contacts;
   a load side voltage sensing module structured to measure second voltages on a load side of the separable contacts;
   a current sensor structured to measure a current flowing through a line to which the separable contacts are coupled; and
   a main controller structured and configured to receive first voltage information based on measurements made by the line side voltage sensing module, second voltage information based on measurements made by the load side voltage sensing module, and current information based on measurements made by the current sensor, wherein the main controller is further structured and configured to: (i) for each of a plurality of arc interruption events in the circuit interrupter, calculate an amount of mass lost by the separable contacts due to contact erosion during the arc interruption event based on one or more of the first voltage information, the second voltage information and the current information, (ii) determine a total mass loss due to contact erosion as a sum of each calculated amount of mass lost by the separable contacts due to contact erosion, and (iii) monitor a remaining life of the separable contacts based on the determined total mass loss due to contact erosion.

2. The electronic trip unit according to claim 1, wherein the main controller is structured and configured to, for each of the plurality of arc interruption events, determine the amount of mass lost by the separable contacts due to contact erosion during the arc interruption event by determining total arc energy for the arc interruption event based on the first voltage information, the second voltage information and the current information and by calculating the amount of mass lost by the separable contacts due to contact erosion during the arc interruption event based on the determined total arc energy.

3. The electronic trip unit according to claim 2, wherein total arc energy for the arc interruption event is determined based on the following expression:

$$W = \int_0^t VI\,dt \text{(Joule)},$$

where W is the total arc energy for the arc interruption event, t is an arcing time for the arc interruption event, V is arc voltage determined from the first voltage information and the second voltage information, and I is arc current determined from the current information.

4. The electronic trip unit according to claim 3, wherein the amount of mass lost by the separable contacts due to contact erosion during the arc interruption event is calculated based on the following equation:

$$\Delta m = K \times \phi\left(\frac{\text{mg}}{\text{Joule}}\right) \times W(\text{Joule}),$$

where $\Delta m$ is the amount of mass lost by the separable contacts due to contact erosion during the arc interruption event, $\phi$ is a mass loss per Joule for a material used in the separable contacts, and K is a coefficient that reflects a time duration during which an arc stays on the separable contacts.

5. The electronic trip unit according to claim 1, wherein the main controller is structured and configured to, for each of the plurality of arc interruption events, determine the amount of mass lost by the separable contacts due to contact erosion during the arc interruption event by determining total electrical charges for the arc interruption event based on the current information and by calculating the mass loss due to contact erosion during the arc interruption event based on the determined total electrical charges.

6. The electronic trip unit according to claim 5, wherein total electrical charges for the arc interruption event is determined based on the following expression:

$$Q=\int_0^t Idt \text{(Coulomb)},$$

where Q is the total electrical charges and t is an arcing time of the arc interruption event.

7. The electronic trip unit according to claim 6, wherein the amount of mass lost by the separable contacts due to contact erosion during the arc interruption event is calculated based on the following equation:

$$\Delta m = K \times \delta\left(\frac{\text{mg}}{\text{Coulomb}}\right) \times Q(\text{Coulomb}),$$

where $\Delta m$ is the amount of mass lost by the separable contacts due to contact erosion during the arc interruption event, $\delta$ is a mass loss per Coulomb of electrical charge for a material used in the separable contacts, and K is a coefficient that reflects a time duration during which an arc stays on the separable contacts.

8. The electronic trip unit according to claim 1, wherein the remaining life of the separable contacts is monitored based on the determined total mass loss due to contact erosion as subtracted from an original contact mass for the circuit interrupter.

9. The electronic trip unit according to claim 1, wherein the main controller is structured and configured to make a determination regarding the remaining life of the separable contacts based on the determined total mass loss due to contact erosion, and cause an output regarding contact life status for the circuit interrupter to be generated based on at least the determination regarding the remaining life of the separable contacts.

10. The electronic trip unit according to claim 9, wherein the main controller is structured and configured to make the determination regarding the remaining life of the separable contacts by comparing the determined total mass loss due to contact erosion to one or more threshold values.

11. A method of monitoring a set of separable contacts of a circuit interrupter, comprising:
measuring first voltages on a line side of the separable contacts;
measuring second voltages on a load side of the separable contacts;
measuring a current flowing through a line to which the separable contacts are coupled;
receiving first voltage information based on the measured first voltages, second voltage information based the measured second voltages, and current information based the measured current;
for each of a plurality of arc interruption events in the circuit interrupter, calculating an amount of mass lost by the separable contacts due to contact erosion during the arc interruption event based on one or more of the first voltage information, the second voltage information and the current information;
determining a total mass loss due to contact erosion based on each calculated amount of mass lost by the separable contacts due to contact erosion; and
monitoring a remaining life of the separable contacts based on the determined total mass loss due to contact erosion.

12. The method according to claim 11, wherein, for each of the plurality of arc interruption events, the amount of mass lost by the separable contacts due to contact erosion during the arc interruption event is determined by determining total arc energy for the arc interruption event based on the first voltage information, the second voltage information and the current information and by calculating the amount of mass lost by the separable contacts due to contact erosion during the arc interruption event based on the determined total arc energy.

13. The method according to claim 12, wherein total arc energy for the arc interruption event is determined based on the following expression:

$$W=\int_0^t VIdt \text{(Joule)},$$

where W is the total arc energy for the arc interruption event, t is an arcing time for the arc interruption event, V is arc voltage determined from the first voltage information and the second voltage information, and I is arc current determined from the current information.

14. The method according to claim 13, wherein the amount of mass lost by the separable contacts due to contact erosion during the arc interruption event is calculated based on the following equation:

$$\Delta m = K \times \phi\left(\frac{\text{mg}}{\text{Joule}}\right) \times W(\text{Joule}),$$

where $\Delta m$ is the amount of mass lost by the separable contacts due to contact erosion during the arc interruption event, $\phi$ is a mass loss per Joule for a material used in the separable contacts, and K is a coefficient that reflects a time duration during which an arc stays on the separable contacts.

15. The method according to claim 11, wherein, for each of the plurality of arc interruption events, the amount of mass lost by the separable contacts due to contact erosion during the arc interruption event is determined by determining total electrical charges for the arc interruption event based on the current information and by calculating the mass loss due to contact erosion during the arc interruption event based on the determined total electrical charges.

16. The method according to claim 15, wherein total electrical charges for the arc interruption event is determined based on the following expression:

$$Q=\int_0^t Idt \text{(Coulomb)},$$

where Q is the total electrical charges and t is an arcing time of the arc interruption event.

17. The method according to claim 16, wherein the amount of mass lost by the separable contacts due to contact erosion during the arc interruption event is calculated based on the following equation:

$$\Delta m = K \times \delta\left(\frac{\text{mg}}{\text{Coulomb}}\right) \times Q(\text{Coulomb}),$$

where $\Delta m$ is the amount of mass lost by the separable contacts due to contact erosion during the arc interruption event, $\delta$ is a mass loss per Coulomb of electrical charge for a material used in the separable contacts, and K is a coefficient that reflects a time duration during which an arc stays on contacts.

18. The method according to claim 11, further comprising making a determination regarding the remaining life of the separable contacts based on the determined total mass loss due to contact erosion, and causing an output regarding contact life status for the circuit interrupter to be generated based on at least the determination regarding the remaining life of the separable contacts.

19. The method according to claim 18, wherein the determination regarding the remaining life of the separable contacts is made by comparing the determined total mass loss due to contact erosion to one or more threshold values.

20. A method according to claim 18, further comprising reporting information regarding the remaining life of the separable contacts to a remote supervisory control and data acquisition (SCADA) system, to a tablet computer or to a smart phone.

21. A computer program product including a non-transitory computer readable medium encoded with a computer program comprising program code for implementing the method of claim 11.

\* \* \* \* \*